United States Patent
Ryu

(10) Patent No.: US 6,979,863 B2
(45) Date of Patent: Dec. 27, 2005

(54) SILICON CARBIDE MOSFETS WITH INTEGRATED ANTIPARALLEL JUNCTION BARRIER SCHOTTKY FREE WHEELING DIODES AND METHODS OF FABRICATING THE SAME

(75) Inventor: Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/422,554

(22) Filed: Apr. 24, 2003

(65) Prior Publication Data

US 2004/0212011 A1 Oct. 28, 2004

(51) Int. Cl.[7] .............................................. H01L 29/76
(52) U.S. Cl. ...................... 257/335; 257/502; 257/471; 257/472; 438/221; 438/186; 438/273
(58) Field of Search ................................ 257/339, 183, 257/341–343, 471, 472, 502, 335; 438/FOR 335, 438/FOR 176, 60, 221, 186, 273

(56) References Cited

U.S. PATENT DOCUMENTS

| | | | |
|---|---|---|---|
| 3,629,011 A | 12/1971 | Tohi et al. ................... 148/1.5 |
| 3,924,024 A | 12/1975 | Naber et al. .................. 427/95 |
| 4,466,172 A | 8/1984 | Batra ........................... 29/571 |
| 4,811,065 A | 3/1989 | Cogan ....................... 357/23.4 |
| 4,875,083 A | 10/1989 | Palmour .................... 357/23.6 |
| 5,111,253 A | 5/1992 | Korman et al. ............... 357/15 |
| 5,170,231 A | 12/1992 | Fujii et al. ................. 357/23.2 |
| 5,170,455 A | 12/1992 | Goossen et al. .............. 385/89 |
| 5,184,199 A | 2/1993 | Fujii et al. ..................... 29/10 |
| 5,270,554 A | 12/1993 | Palmour ....................... 257/77 |
| 5,348,895 A | 9/1994 | Smayling et al. ............. 437/54 |
| 5,384,270 A | 1/1995 | Ueno ........................... 437/40 |
| 5,385,855 A | 1/1995 | Brown et al. .................. 437/41 |
| 5,393,999 A | 2/1995 | Malhi ......................... 257/289 |
| 5,396,085 A | 3/1995 | Baliga .......................... 257/77 |
| 5,479,316 A | 12/1995 | Smrtic et al. ................ 361/322 |
| 5,506,421 A | 4/1996 | Palmour ....................... 257/77 |
| 5,510,281 A | 4/1996 | Ghezzo et al. ................ 437/41 |
| 5,510,630 A | 4/1996 | Agarwal ....................... 257/77 |
| 5,587,870 A | 12/1996 | Anderson et al. ........... 361/313 |
| 5,629,531 A | 5/1997 | Palmour ....................... 257/77 |
| 5,710,059 A | 1/1998 | Rottner ....................... 437/151 |
| 5,726,463 A | 3/1998 | Brown et al. ................. 257/77 |
| 5,734,180 A | 3/1998 | Malhi .......................... 257/77 |
| 5,739,564 A | 4/1998 | Kosa et al. ................. 257/298 |

(Continued)

FOREIGN PATENT DOCUMENTS

DE     198 09 554     9/1998

(Continued)

OTHER PUBLICATIONS

Proceedings of the 14th International Symposium on Power Semiconductor Devices & ICs 2002, IEEE Catalog No. 02CH37306.*

(Continued)

*Primary Examiner*—Fetsum Abraham
(74) *Attorney, Agent, or Firm*—Myers Bigel Sibley & Sajovec

(57) ABSTRACT

Silicon carbide semiconductor devices and methods of fabricating silicon carbide semiconductor devices have a silicon carbide DMOSFET and an integral silicon carbide Schottky diode configured to at least partially bypass a built in diode of the DMOSFET. The Schottky diode may be a junction barrier Schottky diode and may have a turn-on voltage lower than a turn-on voltage of a built-in body diode of the DMOSFET. The Schottky diode may have an active area less than an active area of the DMOSFET.

49 Claims, 6 Drawing Sheets

U.S. PATENT DOCUMENTS

| | | | |
|---|---|---|---|
| 5,763,905 A | 6/1998 | Harris | 257/77 |
| 5,804,483 A | 9/1998 | Harris | 438/268 |
| 5,814,859 A | 9/1998 | Ghezzo et al. | 257/335 |
| 5,837,572 A | 11/1998 | Gardner et al. | 438/199 |
| 5,851,908 A | 12/1998 | Harris et al. | 438/520 |
| 5,877,041 A | 3/1999 | Fuller | 438/105 |
| 5,877,045 A | 3/1999 | Kapoor | 438/151 |
| 5,885,870 A | 3/1999 | Maiti et al. | 438/261 |
| 5,917,203 A | 6/1999 | Bhatnagar et al. | 257/139 |
| 5,939,763 A | 8/1999 | Hao et al. | 257/411 |
| 5,960,289 A | 9/1999 | Tsui et al. | 438/257 |
| 5,972,801 A | 10/1999 | Lipkin et al. | 438/770 |
| 5,976,936 A | 11/1999 | Miyajima et al. | 438/268 |
| 6,020,600 A | 2/2000 | Miyajima et al. | 257/76 |
| 6,025,233 A | 2/2000 | Terasawa | 438/270 |
| 6,025,608 A | 2/2000 | Harris et al. | 257/77 |
| 6,028,012 A | 2/2000 | Wang | 438/779 |
| 6,048,766 A | 4/2000 | Gardner et al. | 438/257 |
| 6,054,352 A | 4/2000 | Ueno | 438/268 |
| 6,063,698 A | 5/2000 | Tseng et al. | 438/585 |
| 6,096,607 A | 8/2000 | Ueno | 438/522 |
| 6,100,169 A | 8/2000 | Suvorov et al. | 438/519 |
| 6,107,142 A | 8/2000 | Suvorov et al. | 438/285 |
| 6,117,735 A | 9/2000 | Ueno | 438/268 |
| 6,133,587 A | 10/2000 | Takeuchi et al. | 257/77 |
| 6,136,728 A | 10/2000 | Wang | 438/773 |
| 6,165,822 A | 12/2000 | Okuno et al. | 438/142 |
| 6,180,958 B1 | 1/2001 | Cooper, Jr. | 257/77 |
| 6,190,973 B1 | 2/2001 | Berg et al. | 438/275 |
| 6,204,203 B1 | 3/2001 | Narwanker et al. | 438/785 |
| 6,211,035 B1 | 4/2001 | Moise et al. | 438/396 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 * | 5/2001 | Williams et al. | |
| 6,246,076 B1 | 6/2001 | Lipkin et al. | 257/77 |
| 6,297,100 B1 | 10/2001 | Kumar et al. | 438/268 |
| 6,297,172 B1 | 10/2001 | Kashiwagi | 438/773 |
| 6,303,508 B1 | 10/2001 | Alok | 438/705 |
| 6,316,791 B1 | 11/2001 | Schorner et al. | 257/77 |
| 6,344,663 B1 | 2/2002 | Slater, Jr. et al. | 257/77 |
| 6,399,996 B1 | 6/2002 | Chang et al. | 257/484 |
| 6,420,225 B1 | 7/2002 | Chang et al. | 438/237 |
| 6,429,041 B1 | 8/2002 | Ryu et al. | 438/105 |
| 6,448,160 B1 | 9/2002 | Chang et al. | 438/527 |
| 6,455,892 B1 | 9/2002 | Okuno et al. | 257/328 |
| 6,551,865 B2 | 4/2003 | Kumar et al. | 438/137 |
| 6,573,534 B1 | 6/2003 | Kumar et al. | 257/77 |
| 6,593,620 B1 * | 7/2003 | Hshieh et al. | |
| 6,610,366 B2 | 8/2003 | Lipkin | 427/378 |
| 6,653,659 B2 | 11/2003 | Ryu et al. | 257/77 |
| 2001/0055852 A1 | 12/2001 | Moise et al. | 438/396 |
| 2002/0030191 A1 | 3/2002 | Das et al. | 257/77 |
| 2002/0038891 A1 | 4/2002 | Ryu et al. | 257/350 |
| 2002/0047125 A1 | 4/2002 | Fukada et al. | 257/77 |
| 2002/0072247 A1 | 6/2002 | Lipkin et al. | 438/767 |
| 2002/0102358 A1 | 8/2002 | Das et al. | 472/376.2 |
| 2004/0211980 A1 | 10/2004 | Ryu | 257/200 |

FOREIGN PATENT DOCUMENTS

| | | |
|---|---|---|
| DE | 198 32 329 A1 | 2/1999 |
| DE | 19900171 | 12/2000 |
| DE | 10036208 | 2/2002 |
| EP | 0 637 069 A1 | 2/1995 |
| EP | 1058317 A2 | 12/2000 |
| EP | 0 637 069 B1 | 1/2001 |
| EP | 1 204 145 A2 | 5/2002 |
| JP | 01117363 | 5/1989 |
| JP | 03034466 | 2/1991 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 02000252461 A | 9/2000 |
| JP | 2000106371 | 4/2001 |
| WO | WO 97/98754 | 3/1997 |
| WO | WO 97/17730 | 5/1997 |
| WO | WO 97/39485 | 10/1997 |
| WO | WO 98/02916 | 1/1998 |
| WO | WO 98/02924 | 1/1998 |
| WO | WO99/63591 | 12/1999 |
| WO | WO 00/13236 | 3/2000 |
| WO | WO 01/78134 A1 | 10/2001 |

OTHER PUBLICATIONS

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Williams et al. "Passivation of the 4H-SiC/SiO$_2$ Interface with Nitric Oxide," *Materials Science Forum*. vols. 389-393 (2002), pp. 967-972.

Dahlquist et al. "A 2.8kV, Forward Drop JBS Diode with Low Leakage," *Materials Science Forum*, vols. 338-342, (2000) pp. 1179-1182.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Ryu et al. Article and Presentation:"27 mΩ-cm$^{2,\ 1.6\ kV\ Power}$ DiMOSFETs in 4H-SiC," *Proceedings of the 14 International Symposium on Power Semiconductor Devices & ICs 2002*, Jun. 4-7, 2002, Santa Fe, NM.

Agarwal et al. "1.1 kV 4H-SiC Power UMOSFETs," *IEEE Electron Device Letters*, vol. 18, No. 12, Dec. 1997, pp. 586-588.

Agarwal et al. "1400 V 4H-SiC Power MOSFET's," *Materials Science Forum* vols. 264-268, pp. 989-992, 1998.

Agarwal et al. "Investigation of Lateral RESURF, 6H-SiC MOSFETs," *Materials Science Forum*, vols. 338-342, (2000) pp. 1307-1310.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Casady et al. "900 V DMOS and 1100 V UMOS 4H-SiC Power FETs," *IEEE Device Research Conference*, Ft. Collins, CO Jun. 23-25, 1997.

Schörner et al. "Rugged Power MOSFETs in 6H-SiC with Blocking Capability up to 1800 V," *Materials Science Forum* vols. 338-342, (2000) pp. 1295-1298.

Shenoy et al. "High-Voltage Double-Implanted Power MOSFETs in 6H-SiC," *IEEE Electron Device Letters*, vol. 18, No. 3, Mar. 1997, pp. 93-95.

Shenoy et al. "The Planar 6H-SiC ACCUFET: A New High-Voltage MOSFET Structure," *IEEE Electron Device Letters*, vol. 18, No. 12, pp. 589-591, Dec. 1997.

Singh et al. "High Temperature, High Current, 4H-SiC Accu-DMOSFET," Materials Science Forum vols. 338-342, (2000) pp. 1271-1274.

Suvorov et al. "4H-SiC Self-Aligned Implant-Diffused Structure for Power DMOSFETs," *Materials Science Forum*, vols. 338-342 (2000), pp. 1275-1278.

Tan et al. "High-Voltage Accumulation-Layer UMOSFETs in 4H-SiC," *IEEE Electron Device Letters,* vol. 19, No. 12, Dec. 1998, pp. 487-489.

Vathulya et al. "Characterization of Channel Mobility on Implanted SiC to Determine Polytype Suitability for the Power DIMOS Structure," *Electronic Materials Conference,* Santa Barbara, CA, Jun. 30-Jul. 2, 1999.

Wang et al. "Accumulation-Mode SiC Power MOSFET Design Issues," *Materials Science Forum,* vols. 338-342, pp. 1287-1290.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference,* Denver, CO Jun. 19-21, 2000.

Xu et al. "Improved Performance and Reliability of $N_2O$-Grown Oxynitride on 6H-SiH," *IEEE Electron Device Letters.* vol. 21, No. 6, Jun. 2000, p. 298-300.

G.Y. Chung, C.C. Tin, J.R. Williams, K. McDonald, R.K. Chanana, R.A. Weller, S.T. Pantelides, L.C. Feldman, O.W. Holland, M.K. Das, and J. W. Palmour, "Improved Inversion Channel Mobility for 4H-SiC MOSFETs Following High Temperature Anneals in Nitric Oxide," *IEEE Electron Device Letters,* vol. 22, No. 4, Apr. 2001.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters,* vol. 76, No. 13, pp. 1713-1715, Mar. 2000.

L.A. Lipkin and J.W. Palmour, "Low interface state density oxides on p-type SiC," Materials Science Forum vols. 264-268, pp. 853-856, 1998.

Baliga, Power Semiconductor Devices, Chapter 7, PWS Publishing, 1996.

U.S. Appl. No. 60/435,212.

U.S. Appl. No. 60/294,307.

U.S. Appl. No. 10/422,130.

Chakraborty et al. "Interface Properties of $N_2O$-annealed $SiO_2$/SiC system," *Proceedings IEEE Hong Kong Electron Devices Meeting.* Jun. 24, 2000, pp. 108-111.

Lipkin et al. "Insulator Investigation on SiC for Improved Reliability," *IEEE Transactions on Electron Devices.* vol. 46, No. 3, Mar. 1999, pp. 525-532.

Mutin, P. Herbert, "Control of the Composition and Structure of Silicon Oxycarbide and Oxynitride Glasses Derived from Polysiloxane Precursors,"*Journal of Sol-Gel Science and Technology.* vol. 14 (1999) pp. 27-38.

del Prado et al. "Full Composition Range Silicon Oxynitride Films Deposited by ECR-PECVD at Room Temperatures," *Thin Solids Films.* vol. 343-344 (1999) p. 437-440.

Wang et al. "High Temperature Characteristics of High-Quality SiC MIS Capacitors with O/N/O Gate Dielectric," *IEEE Transactions on Electron Devices.* vol. 47, No. 2, Feb. 2000.

Lai et al. "Interface Properties of $N_2O$-Annealed $NH_3$-Treated 6H-SiC MOS Capacitor," *Electron Devices Meeting,* Jun. 26, 1999, pp. 46-49.

Lipkin et al. "Challenges and State-of-the-Art of Oxides on SiC," *Mat. Res. Symp. Proc.* vol. 640, 2001.

Cho et al. "Improvement of charge trapping by hydrogen post-oxidation annealing in gate oxide of 4H-SiC methel-oxide-semiconductor capacitors," *Applied Physics Letters.* vol. 77, No. 8, pp. 1215-1217.

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

Suzuki et al. "Effect of Post-oxidation-annealing in Hydrogen on $SiO_2$/4H-SiC Interface," *Materials Science Forum,* vols. 338-342 (2000) 1073-1076.

Leonard et al. "Long term stability of gate-oxides on n- and p-type silicon carbide studied by charge injection techniques," *Materials Science Engineering,* vol. 46, No. 1-3, Apr. 1997, pp. 263-266.

Fukuda et al. "Improvement of $SiO_2$/4H-SiC Interface by Using High Temperature Hydrogen Annealing at 1000° C.," *Extended Abstracts of the International Conference on Solid State Devices and Materials,* Japan Society of Applied Physics, Tokyo, Japan, Sep. 1998.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters,* vol. 76, No. 25, pp. 3744-3746, Jun. 2000.

R. Schorner, P. Friedrichs, D. Peters, and D. Stephani, "Significantly Improved Performance of MOSFETs on Silicon Carbide Using the 15R-SiC Polytype," *IEEE Electron Device Letters,* vol. 20, No. 5, pp. 241-244, May 1999.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

V.V. Afanasev, M. Bassler, G. Pensl, and M. Schulz, "Intrinsic $SiC/SiO_2$ Interface States," *Phy. Stat. Sol. (a),* vol. 162, pp. 321-337, 1997.

S. Sridevan, P.K. McLarty, and B.J. Baliga, "On the Presence of Aluminum in Thermally Grown Oxides on 6H-Silicon Carbide," *IEEE Electron Device Letters,* vol. 17, No. 3, pp. 136-138, Mar. 1996.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials,* vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference,* San Diego, CA, Dec. 3-5, 1998.

S. Sridevan and B. Jayant Baliga, "Lateral N-Channel Inversion Mode 4H-SiC MOSFET's," *IEEE Electron Device Letters,* vol. 19, No. 7, pp. 228-230, Jul. 1998.

D. Alok, E. Arnold, and R. Egloff, "Process Dependence of Inversion Layer Mobility in 4H-SiC Devices," *Materials Science Forum,* vols. 338-342, pp. 1077-1080, 2000.

K. Ueno and Tadaaki Oikawa, "Counter-Doped MOSFET's of 4H-SiC." *IEEE Electron Device Letters,* vol. 20, No. 12, pp. 624-626, Dec. 1999.

V. R. Vathulya, H. Shang, and M. H. White, "A Novel 6H-SiC Power DMOSFET with Implanted P-Well Spacer," *IEEE Electron Device Letters*, vol. 20, No. 7, Jul. 1999, pp. 354-356.

A.K. Agarwal, S. Seshadri, and L. B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*, vol. 75, No. 3, Feb. 1, 1994, pp. 1811-1817.

Sze, S:M. *Physics of Semiconductor Devices*, John Wiley & Sons, p. 383-390.

H.F. Li, S. Dimitrijev, H.B. Harrison, D. Sweatman, and P.T. Tanner. "Improving $SiO_2$ Grown on P-Type 4H-SiC by NO Annealing." *Materials Science Forum*. vols. 264-268 (1998) pp. 869-872.

K. Ueno, R. Asai, and T. Tsuji. "4H-SiC MOSFET's Utilizing the $H_2$ Surface Cleaning Technique." *IEEE Electron Device Letters*, vol. 19, No. 7, Jul. 1998, pp. 244-246.

Chung et al. "The Effect of Si:C Source Ratio on $SiO_2$/SiC Interface State Density for Nitrogen Doped 4H and 6H-SiC," *Materials Science Forum*. (2000) vols. 338-342, pp. 1097-1100.

Pantelides et al. "Atomic-Scale Engineering of the SiC-$SiO_2$ Interface," *Materials Science Forum*. (2000) vols. 338-342, pp. 1133-1136.

Jamet et al. "Physical properties of $N_2O$ and NO-nitrided gate oxides grown on 4H-SiC," *Applied Physics Letters*. vol. 79, No. 3, Jul. 16, 2001, pp. 323-325.

Agarwal et al. "A Critical Look at the Performance Advantages and Limitations of 4H-SiC Power UMOSFET Structures," *1996 IEEE ISFSD and IC's Proc.*, May 20-23, 1996, pp. 119-122.

Kobayashi et al. "Dielectric Breakdown and Current Conduction of Oxide/Nitride/Oxide Multi-Layer Structures," *1990 IEEE Symposium on VLSI Technology*. pp. 119-120.

Ma et al. "Fixed and trapped charges at oxide-nitride-oxide heterostructure interfaces formed by remote plasma enhanced chemical vapor deposition," *J. Vac. Sci. Technol. B*. Vol. 11, No. 4, Jul./Aug. 1993, pp. 1533-1540.

Das, Mrinal K. Graduate thesis entitled, *Fundamental Studies of the Silicon Carbide MOS Structure*. Purdue University, 1999.

Dimitrijev et al., "Nitridation of Silicon-Dioxide Films Grown on 6H Silicon Carbide", *IEEE Electronic Device Letters*, vol. 18, No. 5, May. 5, 1997, pp. 175-177.

De Mao et al., "Thermal Oxidation of SiC in $N_2$ O", *J. Electrochem. Soc.*, vol. 141, 1994, pp. L150-L152.

Fukuda et al. "Improvement of $SiO_2$/4H-SiC Interface by Using High Temperature Hydrogen Annealing at 1000° C.," *Extended Abstracts of the International Conference on Solid State Devices and Materials*. Japan Society of Applied Physics, Tokyo, Japan, Sep. 1998.

Palmour et al. "SiC Device Technology: Remaining Issues," Diamond and Related Materials, vol. 6, 1997, pp. 1400-1404.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Al and N Ion Implantations in 6H-SiC," Silicon Carbide and Related Materials. 1995 Conf, Kyoto, Japan. Published 1996.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Patel, R., et al., Phosphorus-Implanted High-Voltage N.sup.+P 4H-SiC Junction Rectifiers, Proceedings of 1998 International Symposium on Poer Semiconductor Devices & ICs, pp. 387-390 (Kyoto).

Dastidar, Sujoyita, A Study of P-Type Activation in Silicon Carbide, Thesis (Purdue University, May 1998).

* cited by examiner

SILICON CARBIDE MOSFETS WITH INTEGRATED ANTIPARALLEL JUNCTION BARRIER SCHOTTKY FREE WHEELING DIODES AND METHODS OF FABRICATING THE SAME

FIELD OF THE INVENTION

The present invention relates to semiconductor devices and the fabrication of semiconductor devices and more particularly, to silicon carbide (SiC) metal-oxide semiconductor field effect transistors (MOSFETs) and the fabrication of such MOSFETs.

BACKGROUND OF THE INVENTION

Power devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and with lower specific on-resistance than conventional silicon-based power devices. A theoretical analysis of the superiority of silicon carbide devices over silicon devices is found in a publication by Bhatnagar et al. entitled *"Comparison of 6H—SiC, 3C—SiC and Si for Power Devices"*, IEEE Transactions on Electron Devices, Vol. 40, 1993, pp. 645–655. A power MOSFET fabricated in silicon carbide is described in U.S. Pat. No. 5,506,421 to Palmour entitled "Power MOSFET in Silicon Carlide" and assigned to the assignee of the present invention.

A number of silicon carbide power MOSFET structures have been described in the literature. See e.g. U.S. Pat. No. 5,506,421; A. K. Agarwal, J. B. Casady, L. B. Rowland, W. F. Valek, M. H. White, and C. D. Brandt, "1.1 kV 4H—SiC Power UMOSFET's," IEEE Electron Device Letters, Vol. 18, No. 12, pp. 586–588, December 1997; A. K. Agarwal, J. B. Casady, L. B. Rowland, W. F. Valek and C. D. Brandt, "1400 V 4H—SiC Power MOSFETs," Materials Science Forum Vols. 264–268, pp. 989–992, 1998; J. Tan, J. A. Cooper, Jr., and M. R. Melloch, "High-Voltage Accumulation-Layer UMOSFETs in 4H—SiC," IEEE Electron Device Letters, Vol. 19, No. 12, pp. 487–489, December 1998; J. N. Shenoy, J. A. Cooper and M. R. Melloch, "High-Voltage Double-Implanted Power MOSFET's in 6H—SiC," IEEE Electron Device Letters, Vol. 18, No. 3, pp. 93–95, March 1997; J. B. Casady, A. K. Agarwal, L. B. Rowland, W. F. Valek, and C. D. Brandt, "900 V DMOS and 1100 V UMOS 4H—SiC Power FETs," IEEE Device Research Conference, Ft. Collins, Colo., Jun. 23–25, 1997; R. Schomer, P Friedrichs, D. Peters, H. Mitlehner, B. Weis and D. Stephani, "Rugged Power MOSFETs in 6H—SiC with Blocking Capability up to 1800 V," Materials Science Forum Vols. 338–342, pp. 1295–1298, 2000; V. R. Vathulya and M. H. White, "Characterization of Channel Mobility on Implanted SiC to determine Polytype suitability for the Power DIMOS structure," Electronic Materials Conference, Santa Barbara, Calif., Jun. 30–Jul. 2, 1999; A. V. Suvorov, L. A. Lipkin, G. M. Johnson, R. Singh and J. W. Palmoutr, "4H—SiC Self-Aligned Implant-Diffused Structure for Power DMOS-FETs," Materials Science Forum Vols. 338–342, pp. 1275–1278, 2000; P. M. Shenoy and B. J. Baliga, "The Planar 6H—SiC ACCUFET: A New High-Voltage Power MOSFET Structure," IEEE Electron Device Letters, Vol. 18, No. 12, pp. 589–591, December 1997; Ranbir Singh, Sei-Hyung Ryu and John W. Palmour, "High Temperature, High Current, 4H—SiC Accu-DMOSFET," Materials Science Forum Vols. 338–342, pp. 1271–1274, 2000; Y. Wang, C. Weitzel and M. Bhatnagar, "Accumulation-Mode SiC Power MOSFET Design Issues," Materials Science Forum Vols. 338–342, pp. 1287–1290, 2000; A. K. Agarwal, N. S. Saks, S. S. Mani, V. S. Hegde and P. A. Sanger, "Investigation of Lateral RESURF, 6H—SiC MOSFETs," Materials Science Forum Vols. 338–342, pp. 1307–1310, 2000; and Shenoy et al., "High-Voltage Double-Implanted Power MOSFET's in 6H—SiC," IEEE Electron Device Letters, Vol. 18, No. 3, March 1997, pp. 93–95.

One widely used silicon power MOSFET is the double diffused MOSFET (DMOSFET) that is fabricated using a double-diffusion process. A conventional DMOSFET 510 in silicon is illustrated in FIG. 1A. In these devices, a p-base region 514 and an n$^+$ source region 516 are diffused in a substrate 512 through a common opening in a mask. The p-base region 514 is driven in deeper than the n$^+$ source region 516. The difference in the lateral diffusion between the p-base 514 and n$^+$ source regions 16 forms a surface channel region. A gate oxide 518 is provided on the substrate 512 and a gate contact 520 on the gate oxide 518. A source contact is provided on the substrate 512 between the n$^+$ source regions 516. A drain contact 524 is provided on the substrate 512 opposite the source contact 522. An overview of power MOSFETs including DMOSFETs may be found in the textbook entitled *"Power Semiconductor Devices"* by B. J. Baliga, published by PWS Publishing Company, 1996, and specifically in Chapter 7, entitled *"Power MOSFET"*, the disclosure of which is hereby incorporated herein by reference. The DMOSFET structure has also been fabricated in silicon carbide, however, because of the low diffusion of dopants in silicon carbide, other techniques, such as double implants, have been used in fabricating DMOSFETs in silicon carbide. Thus, the term "DMOSFET" is used herein to refer to a structure similar to that of FIG. 1A having a base or well region and source regions in the base or well region irrespective of the methods used in fabricating the structure.

As illustrate in FIG. 1B, the power MOSFET of FIG. 1A can be modeled as a switch and an anti-parallel diode (the built-in body diode). A power MOSFET is a majority carrier device with very high switching speeds. However, in many cases, the switching of the power MOSFET is limited by the speed of the built-in body diode. The anti-parallel p-n diode is built into the MOSFET between the p-base region 514 and the n-type drift region of the substrate 512. In the first quadrant of operation (positive drain current and drain voltage), the device works as a switch. In the third quadrant of operation (negative drain current and drain voltage), with a gate bias of 0 volts, the device works as a PiN diode. However, the built-in body diode may limit operation of the device at high frequencies, for example, frequencies greater than 100 kHz. Such may be the case because the built-in body diode is a relatively slow minority carrier device. A PiN diode has a high minority carrier lifetime and may often fail to keep Up with the switching speed of the MOSFET. Therefore, the switching speed of the power MOSFET may be need to reduced. Alternatively the use of series Schottky diodes with an ultra fast recovery rectifier in an anti-parallel configuration for the whole assembly may be used or a "snubber" circuit have been proposed, for example, in high speed applications such as pulse width modulated DC motor controllers. See e.g. Motorola Power MOSFET Transistor Databook, 4$^{th}$ edition, Motorola, Inc., 1989. However, external snubber circuits may be expensive and bulky.

The use of an external fast recovery anti-parallel diode is described by Mondal et al., "An Integrated 500-V Power DMOSFET/Antiparallel Rectifier Device with Improved Diode Reverse Recovery Characteristics," IEEE Electron Device Letters, Vol. 23, No. 9, September 2002. However, this method may be ineffective because in the reverse recovery mode the slowest diode provides the dominant current path. Thus, the current rating of the external fast recovery diode should be much higher than the built-in body diode of the MOSFET so that most of the on-current flows through the external diode, leaving a very small amount of current flowing through the body diode, resulting in a very small reverse recovery charge in the body diode. However, this leads to large parasitic output capacitance of the MOSFET-diode pair since a large area diode is needed in parallel configuration.

Mondal et al. also describes an attempt to integrate a Merged PiN Schottky (MPS) diode with a silicon power DMOSFET to achieve better reverse recovery characteristics. The DMOSFET with the integrated MPS diode showed a 30% decrease in peak reverse current and minority carrier stored charge.

SUMMARY OF THE INVENTION

Embodiments of the present invention provide silicon carbide semiconductor devices and methods of fabricating silicon carbide semiconductor devices having a silicon carbide DMOSFET and an integral silicon carbide Schottky diode configured to have a turn-on voltage lower than a turn-on voltage of a built-in body diode of the DMOSFET.

In further embodiments of the present invention, the integral silicon carbide Schottky diode is an integral silicon carbide junction barrier Schottky (JBS) diode. For example, the integral JBS diode may have a turn-on voltage of about 1 volt.

In particular embodiments of the present invention, the silicon carbide Schottky diode includes a Schottky contact adjacent and coupled to the source region, a drift region common with a drift region of the DMOSFET and a second contact common with a drain contact of the DMOSFET. The silicon carbide Schottky diode may also include a p-type junction barrier Schottky (JBS) grid adjacent a source region of the DMOSFET. The p-type region of the JBS grid may have an ohmic contact to a source electrode of the DMOSFET and contact a p-type well region of the DMOSFET.

In certain embodiments of the present invention, the Schottky contact is in direct contact with the source region.

The Schottky contact may also be coupled to the source region through a source contact of the DMOSFET.

In still further embodiments of the present invention, an active area of the integral silicon carbide JBS diode is less than the active area of the silicon carbide DMOSFET. For example, the active area of the integral silicon carbide JBS diode may be less than about 50%, 25% or 20% the active area of the silicon carbide DMOSFET.

In additional embodiments of the present invention a silicon carbide semiconductor device includes a first n-type silicon carbide layer and a p-type silicon carbide well region in the first n-type silicon carbide layer. The p-type silicon carbide well region extends to a first surface of the first n-type silicon carbide layer. A second n-type silicon carbide layer is provided in the first n-type silicon carbide layer adjacent a portion of p-type silicon carbide well region. The second n-type silicon carbide layer extends to the first surface of the first n-type silicon carbide layer and has a carrier concentration that is higher than a carrier concentration of the first n-type silicon carbide layer. A gate insulator layer is provided on the first n-type silicon carbide layer, the second n-type silicon carbide layer and the p-type silicon carbide well region. A plurality of spaced apart p-type silicon carbide regions are provided in the first n-type silicon carbide to provide a junction barrier grid. A peripheral one of the plurality of spaced apart p-type silicon carbide regions is adjacent the second n-type silicon carbide region and the p-type silicon carbide well region. A Schottky contact is provided on the first n-type silicon carbide layer and the plurality of p-type silicon carbide regions. A source contact is provided adjacent the Schottky contact and on the second n-type silicon carbide layer. A gate contact is provided on the gate insulator layer and a drain contact is provided on the first n-type silicon carbide layer opposite the first surface of the first n-type silicon carbide layer.

In further embodiments of the present invention, a third n-type silicon carbide layer is disposed between the drain contact and the first n-type silicon carbide layer. The third n-type silicon carbide layer may have a carrier concentration higher than a carrier concentration of the first n-type silicon carbide layer. A metal overlay may also be provided on the source contact and the Schottky contact so as to connect the source contact to the Schottky contact.

Additionally, the peripheral one of the plurality of p-type silicon carbide regions may contact the p-type silicon carbide well region. The source contact may also be on a portion of the peripheral one of the plurality of p-type silicon carbide regions. The plurality of spaced apart p-type silicon carbide regions may have a higher doping concentration than a doping concentration of the p-type silicon carbide well region.

In particular embodiments of the present invention, the Schottky contact, the plurality of spaced apart p-type silicon carbide regions, the first n-type silicon carbide layer and the drain contact provide a Schottky diode having a turn-on voltage less than a turn-on voltage of a built-in pn junction of the first n-type layer of silicon carbide and the p-type well region.

In certain embodiments of the present invention, the first n-type silicon carbide layer has a doping concentration of from about $5 \times 10^{14}$ to about $2 \times 10^{16}$ cm$^{-3}$. The first n-type silicon carbide layer may also have a thickness of from about 5 to about 30 µm. The p-type silicon carbide well region may have a doping concentration of from about $10^{16}$ to about $10^{20}$ cm$^{-3}$. The p-type silicon carbide well region may extend to a depth of from about 0.5 to about 1.5 µm into the first n-type silicon carbide layer. The plurality of spaced apart p-type silicon carbide regions may also have a doping concentration of from about $10^{18}$ to about $10^{20}$ cm$^{-3}$. The plurality of spaced apart p-type silicon carbide regions may be spaced apart a distance of from about 0.5 to about 10 μm. The plurality of spaced apart p-type silicon carbide regions may be uniformly or non-uniformly spaced apart. The plurality of spaced apart p-type silicon carbide regions may also have respective widths of from about 0.5 to about 10 μm. The second n-type silicon carbide layer may have a doping concentration of from about $10^{19}$ to about $10^{21}$ cm$^{-3}$ and may extend to a depth of from about 0.1 to about 0.7 μm into the first n-type silicon carbide layer.

Additional embodiments of the present invention provide a silicon carbide semiconductor device that includes a silicon carbide DMOSFET and means for at least partially bypassing a built-in pn junction diode between a well region and a drift region of the DMOSFET. The means for at least partially bypassing are integral to the silicon carbide DMOSFET. The means for at least partially bypassing may be an integral silicon carbide diode between a source contact and a drain contact of the DMOSFET. The integral silicon carbide diode may have a lower turn-on voltage than the built-in pn junction diode. The integral silicon carbide diode may be a Schottky diode and, in some embodiments, a junction barrier Schottky diode.

Furthermore, the means for at least partially bypassing may be means for completely bypassing a built-in pn junction diode between a well region and a drift region of the DMOSFET. The means for completely bypassing are also integral to the silicon carbide DMOSFET.

Methods of fabricating devices according to embodiments of the present invention are also provided.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As illustrated in the Figures, the sizes of layers or regions are exaggerated for illustrative purposes and, thus, are provided to illustrate the general structures of the present invention. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention provide silicon carbide MOSFETs and/or methods of fabricating silicon carbide MOSFETs having an integral anti-parallel silicon carbide diode. The integral anti-parallel silicon carbide diode, which may be a JBS diode, is in parallel to the built-in body diode of the DMOSFET and, has a turn-on voltage that is less than the turn-on voltage of the built-in body diode of the DMOSFET. Implanted pn junctions in silicon carbide with moderate p implant doses have been shown to have very limited current injection capabilities. Furthermore, pn junctions in silicon carbide require at least 2.6 V of forward drop to be turned on. Therefore, when paralleled with a Schottky/junction barrier Schottky (JBS) structure in silicon carbide, which requires about 1 V to be turned on, the injection from the pn junction can be reduced and/or minimized. In certain cases, the pn junction diode can be completely bypassed. Accordingly, embodiments of the present invention may provide a very fast switching silicon carbide semiconductor device.

Figure 1A:
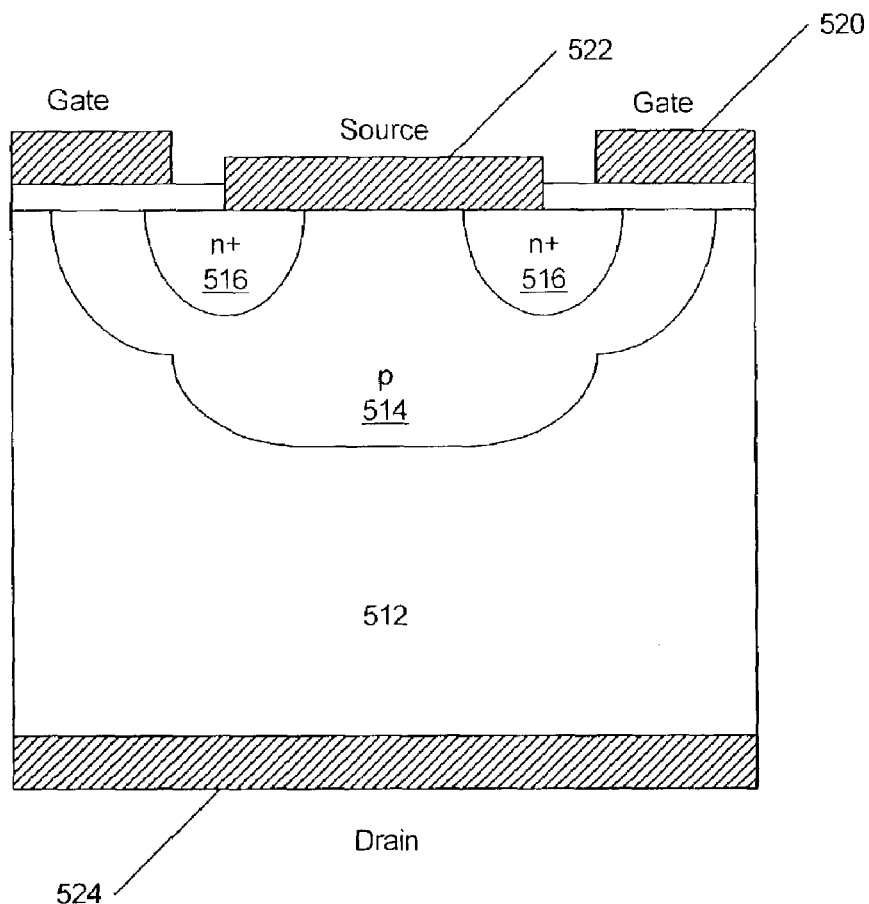
FIG. 1A is a cross-sectional view of a conventional DMOSFET.
Figure 1B:
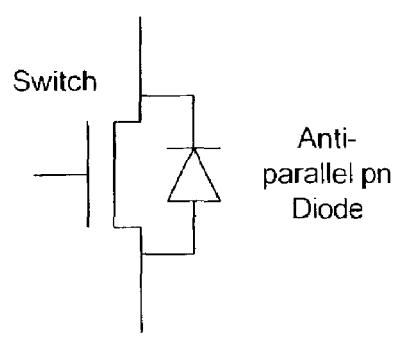
FIG. 1B is schematic diagram of a model of the DMOSFET of FIG. 1A.
Figure 2A:
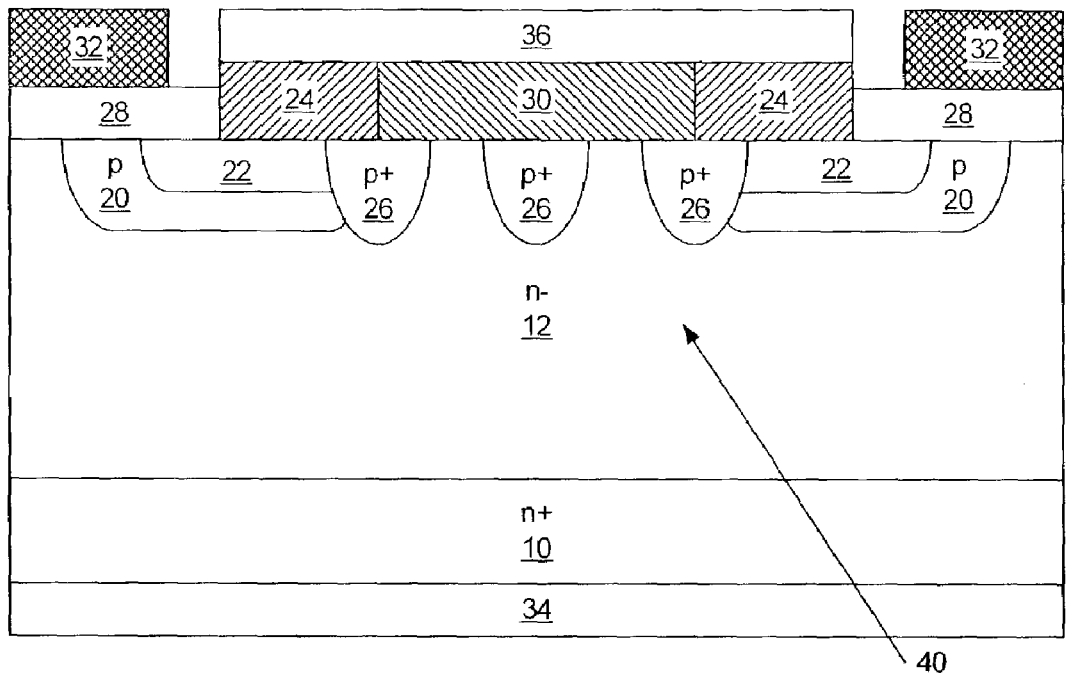
FIG. 2A is a cross-sectional view of a SiC MOSFET according to embodiments of the present invention.

Silicon carbide semiconductor devices according to certain embodiments of the present invention are illustrated in FIG. 2A. As seen in FIG. 2A, in particular embodiments of the present invention, a lightly doped n$^-$ drift layer 12 of silicon carbide is on an optional n$^+$ layer 10 of silicon carbide. The n$^-$ drift layer 12 maybe a substrate or an epitaxial layer of silicon carbide and may, for example, be 4H polytype silicon carbide. In certain embodiments, the n$^-$ drift layer 12 has a carrier concentration of from about $10^{14}$ to about $5 \times 10^{16}$ cm$^{-3}$. In further embodiments of the present invention, the n$^-$ drift layer 12 has a doping concentration of from about $5 \times 10^{14}$ cm$^{-3}$ to about $2 \times 10^{16}$ cm$^{-3}$. Furthermore, in some embodiments of the present invention, the drift layer 12 has a thickness of from about 5 μm to about 150 μm and in further embodiments from about 5 to about 30 μm. Furthermore, the n$^+$ layer 10 may be an implanted layer or region, an epitaxial layer or a substrate. In some embodiments, the n$^+$ layer 10 has a carrier concentration of from about $10^{18}$ to about $10^{21}$ cm$^{-3}$.

As is further seen in FIG. 2A, spaced apart regions of p-type silicon carbide provide p-wells 20 in the drift layer 12. In particular embodiments, the p-wells 20 have a doping concentration of from about $10^{16}$ to about $10^{20}$ cm$^{-3}$. Furthermore, the p-wells 20 may provide a junction depth (i.e be implanted to a depth) of from about 0.5 μm to about 1.5 μm.

In some embodiments, the p-wells 20 are implanted with Al and annealed at a temperature of at least about 1400° C. However, other suitable p-type dopant, such as boron, may be utilized in providing the p-wells 20. In certain embodiments, an activation anneal may occur after implantation of each of the implanted regions including, for example, the p$^+$ regions 26. The doping profile of the p-wells 20 may be a substantially uniform profile or a non-uniform profile, such as a retrograde profile (increasing doping with depth to provide a buried peak) or the p-wells may be totally buried (with some n-type silicon carbide above the p-wells 20). While various p-type dopants may be utilized, Al is utilized in some embodiments because boron tends to diffuse over several microns when annealed at temperatures exceeding 1500° C. Therefore, it may be difficult to control the precise gap between the p-wells 20 and/or the depth of the p-wells 20.

Regions of n$^+$ silicon carbide 22 are disposed within the p-wells 20. In some embodiments, the regions of n$^+$ silicon carbide 22 are spaced from about 0.5 μm to about 5 μm from the edge of the p-wells 20. The regions of n+ silicon carbide 22 may have a doping concentration of from about $10^{19}$ cm$^{-3}$ to about $10^{21}$ cm$^{-3}$ and may extend to a depth of from about 0.1 μm to about 0.7 μm into the p-wells 20 but are shallower than the depth of the p-wells 20. Suitable n-type dopants include phosphorous and nitrogen or other n-type dopants known to those of skill in the art.

As is further illustrated in FIG. 2A, a junction barrier grid 40 is provided in the drift layer 12 adjacent n-type source regions 22 and the p-well 20. The junction barrier grid 40 may comprise a plurality of spaced apart p+ silicon carbide regions 26. The regions of p+ silicon carbide 26 may have a doping concentration of from about $10^{18}$ cm$^{-3}$ to about $10^{20}$ cm$^{-3}$ and may extend to a depth of from about 0.3 μm to about 1.5 μm into drift layer 12. The number of p+ regions 26 in the JBS grid 40 may depend on the desired size of the anti-parallel JBS diode to be provided. In general, however, p+ regions 26 may have a width of from about 0.5 to about 10 μm and may be spaced apart a distance of from about 0.5 to about 10 μm. The width and spacing of the p+ regions 26 may be constant or may vary. The peripheral ones of the plurality of spaced apart p+ regions 26 may contact the n+ regions 22 and the p-well region 20. Thus, in addition to providing protection to a Schottky interface in a blocking state, the p+ regions 26 may also provide a connection from the p-well 20 to a source contact 24.

A Schottky contact 30 is provided on the n–drift layer 12 in the region of the junction barrier grid 40. The Schottky contact 30 may extend between peripheral ones of the p+ regions 26 and contact both the n− drift layer 12 and the p+ regions 26. In certain embodiments, the Schottky contact is Ti, Ni, PT, Cr and/or Ta. Furthermore, in particular embodiments, the Schottky contact has a thickness of from about 100 to about 5000 Å.

The gate oxide 28 is provided on a first surface of the drift layer 12 and extends over the p-well region 20 and at least a portion of the n+ regions of silicon carbide 22 and has a gate contact 32 thereon. In some embodiments, the gate oxide 28 may be either a thermally grown oxide with an NO or N$_2$O anneal or Oxide/Nitride/Oxide (ONO) where the first oxide is a thermal oxide followed by an NO or N$_2$O anneal. The gate contact material may be any suitable contact material. In some embodiments, the gate contact material is molybdenum or p-type polysilicon. P-type polysilicon may be suitable in some embodiments because of its high work function. The thickness of the gate oxide 28 may depend on the work function of the material of the gate contact 32. However, in general, thicknesses of from about 100 Å to about 5000 Å are preferred.

One or more source contacts 24 and a drain contact 34 are also provided. Source contacts 24, in some embodiments are formed of nickel (Ni), titanium (Ti), platinum (Pt) or aluminum (Al), chromium (Cr), combinations thereof, such as Ti/Ni, Al/Ni or Cr/Ni stacks, alloys thereof, such as NiCr, and/or other suitable contact materials and may be annealed at temperatures of from about 600° C. to about 1100° C., for example, 825° C., so as to provide an ohmic contact to both the p+ regions 24 and the n+ regions 22. The drain contact 34 may be Ni or Ti or other such suitable material for forming an ohmic contact to n-type silicon carbide. The ohmic contacts 24 and 34 may have a thickness of from about 150 to about 3000 Å.

Differing or the same contact materials may be utilized to contact the p+ regions 22 and the n+ regions 24. Furthermore, as illustrated in FIG. 2A, a metal overlayer 36 may be provided on the source contacts 24 and the Schottky contact 30 to connect the source contact 24 to the Schottky contact 30. According to certain embodiments of the present invention, the overlayer 36 may be gold, aluminum or other suitable metal. For example, overlayers having a thickness of from about 1000 Å to about 10 μm may be provided. Additional overlayers may also be provided one or more of the contacts. Techniques and materials for providing metal overlayers are known to those of skill in the art and, therefore, are not discussed further herein.

As seen in FIG. 2A, an integral silicon carbide JBS diode is provided by the drift layer 12, the p-type regions 26, the Schottky contact 30 and the drain contact 34. Thus, the drift layer 12 provides a common drift layer between the JBS diode and the DMOSFET. Furthermore, the drain contact 34 provides a common contact between the JBS diode and the DMOSFET. In certain embodiments of the present invention, the JBS diode occupies less than about 50% of the active area of the DMOSFET. In further embodiments, the JBS diode occupies about 25% of the active area of the DMOSFET and, in particular embodiments, about 20% of the active area of the DMOSFET. The area of the JBS diode is defined as the area of the Schottky contact 30. The area of the DMOSFET is defined as the area of the n+ source regions 22, p-well regions 20 and the JFET region, which is defined as the region between two adjacent p-well regions.

While FIG. 2A illustrates embodiments of the present invention as a discrete device, as will be appreciated by those of skill in the art, FIG. 2A may be considered a unit cells of a device having multiple cells. Thus, for example, additional unit cells may be incorporated into the device illustrated in FIG. 2A by dividing the device along its central axis (illustrated as the vertical axis in FIG. 2A) and rotating the divided device about an axis of the periphery of the devices illustrated in FIG. 2A (the vertical edges of the devices illustrated in FIG. 2A). Accordingly, embodiments of the present invention include devices such as those illustrated in FIG. 2A as well as devices having a plurality of unit cells incorporating the integral anti-parallel JBS diode illustrated in FIG. 2A.

Figure 2B:
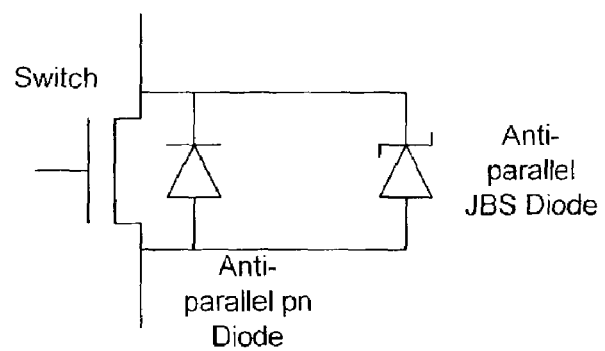
FIG. 2B is a schematic diagram of a model of the SiC MOSFET of FIG. 2A.

FIG. 2B is a schematic of a model of a silicon carbide semiconductor device according to embodiments of the present invention. As seen in FIG. 2B, the device of FIG. 2A can be modeled as a silicon carbide switch with a built-in anti-parallel PiN diode and an integrated anti-parallel Schottky diode. Particular embodiments of the present invention may, for example, provide MOSFETs with built-in JBS diodes having blocking voltages ranging from about 600V to about 3000V. Because of the relatively low MOS channel mobility in a silicon carbide MOSFET, the on-resistance of the power MOSFET is not dominated by drift layer resistance as is the case in silicon MOSFETs, but is dominated by MOSFET channel resistance. For example, for 4H—SiC DMOSFETs with blocking voltages ranging from 1600 V to 2400 V, the on-resistance ranged from 27 mΩ-cm$^2$ to 42 mΩ-cm$^2$. The JBS diode that shares the same drift layer may have much lower on-resistance. For example, a JBS diode in 4H—SiC with a blocking voltage of 2.8 kV may have an on-resistance of 8 mΩ-cm$^2$, about 3 to 5 times lower than that of a 4H—SiC MOSFET. Therefore, if the same forward voltage drop is allowed for the MOSFET and the built-in JBS diode, the are of the integrated JBS diode can be smaller, and even much smaller than the active area of the MOSFET.

Furthermore, as discussed briefly above, silicon carbide is a wide bandgap material (~3.2 eV for 4H polytype). Therefore, pn junctions in silicon carbide do not turn on unless a forward bias greater than 2.6 V is applied. Most JBS diodes in silicon carbide with blocking voltages less than or equal to 3000 V can have extremely high current density when a forward bias of 2.6 V is applied. For example, a diode which uses Ti as the Schottky metal can block 2.8 kV in reverse bias and can have an on-current density of 200 A/cm$^2$ at a forward bias of 2.6 V. If the ratio of power MOSFET active area and the built-in Schottky/JBS diode area are so that the built-in Schottky/JBS diode can flow full switch current of the MOSFET with a forward drop less than or equal to 2.6 V in the free wheeling mode, then the built-in PiN body diode can be completely disabled and reverse recovery charge can be eliminated. Accordingly, in some embodiments of the present invention, the area of the integral JBS diode is selected to flow the full switch current of the MOSFET at a bias voltage of less than or equal to 2.6 V.

Additionally, because DMOSFETs formed in silicon carbide are formed by implantation with limited diffusion, the PiN body diode may exhibit a high forward drop. For example, a silicon carbide DMOSFET with a blocking voltage of 2.4 kV and an approximate area of 2×2 mm has been fabricated where the PiN body diode exhibited a forward drop of 11 V when carrying a full switch current of 2 A. Such may result from the damage created by the p-type implantation which may limit the carrier injection from the implanted pn junction, even though the implant anneal was sufficient to reduce or minimize leakage current from the pn junction in blocking state. Such characteristics may be advantageously utilized in embodiments of the present invention as the pn junction of the JBS structures may provide adequate protection of the Schottky interface in reverse bias but have very limited minority carrier injection in the drift layer in forward bias. Thus, because even higher forward drop may be utilized with the free wheeling JBS diode, the JBS diode may be an even smaller percentage of the active area of the DMOSFET without adversely affecting the reverse recovery characteristics.

Fabrication of devices according to embodiments of the present invention having an integral JBS diode will now be described with reference to FIGS. 3A through 3H. As will be appreciated by those of skill in the art in light of the present disclosure, embodiments of the present invention having an integral anti-parallel JBS diode may be provided by modifying the operations described herein and, therefore, should not be construed as limited to the operations or sequence of operations described herein.

Figure 3A:
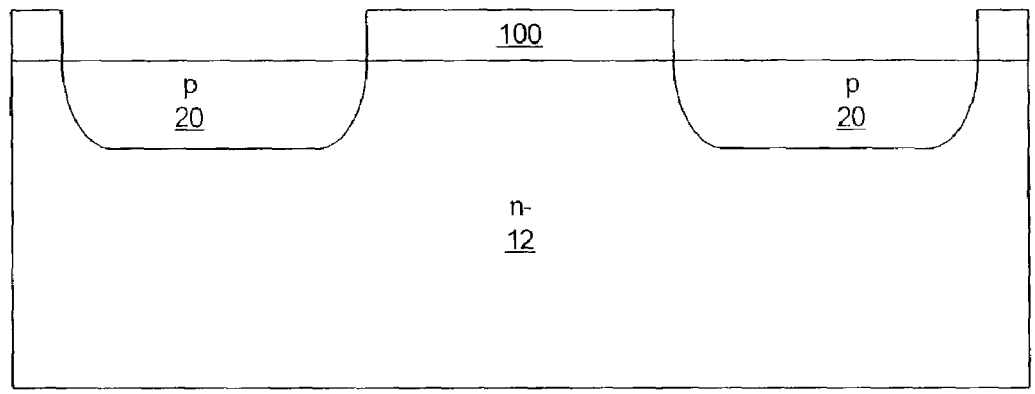
FIGS. 3A through 3H illustrate processing steps in the fabrication of MOSFETS according to various embodiments of the present invention.

As seen in FIG. 3A, a mask 100 is formed and patterned on the n-type drift layer 12 and impurities are implanted into the n-type drift layer 12 to provide the p-wells 20. The implanted impurities may be implanted to the depths described above and to provide the desired carrier concentrations when activated. The n-type drift layer 12 may be a substrate or an epitaxial layer. Furthermore, the drift layer 12 may be provided on an n$^+$ silicon carbide substrate. In such embodiments, the n$^+$ layer described below may be provided by the substrate rather than through implantation.

Figure 3B:
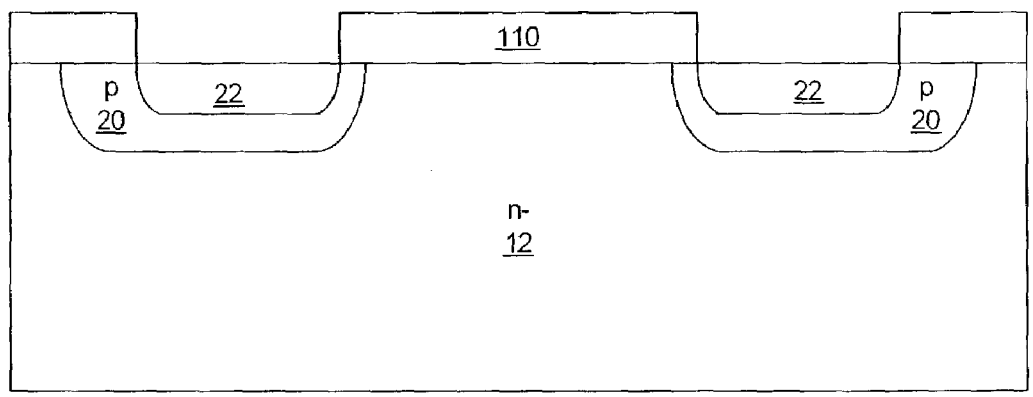

As is seen in FIG. 3B, the mask 100 is removed and a mask 110 is formed and patterned and n-type impurities are implanted utilizing the mask 110 to provide the n$^+$ regions 22. The mask 110 is formed to provide the desired spacing between the periphery of the p-wells 20 and the n$^+$ regions 22 that defines the channel length. Suitable n-type impurities include nitrogen and phosphorous. Furthermore, the impurities may be implanted to provide the dimensions and carrier concentrations of the n$^+$ regions 22 described herein.

Figure 3C:
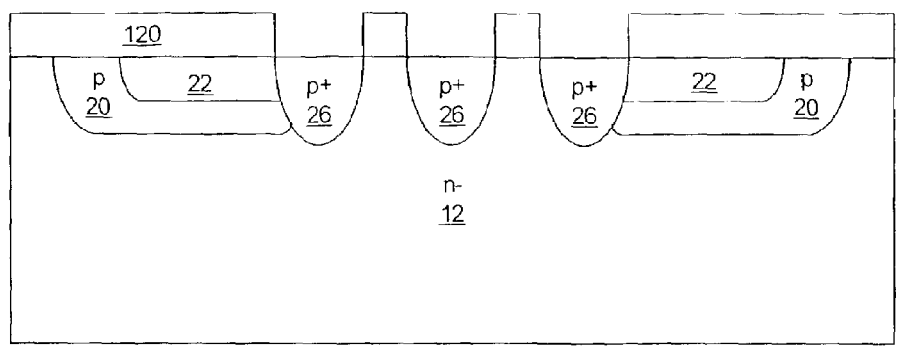

FIG. 3C illustrates the formation of the p$^+$ regions 26 of the junction barrier grid 40. The mask 110 is removed and a mask 120 is formed and patterned and p-type impurities are implanted utilizing the mask 120 to provide the p$^+$ regions 26. The p-type impurities may be implanted to provide the dimensions and carrier concentrations of the p$^+$ regions 26 described herein. In some embodiments, the p-type impurity is aluminum, however, other suitable p-type impurities may also be utilized.

Figure 3D:
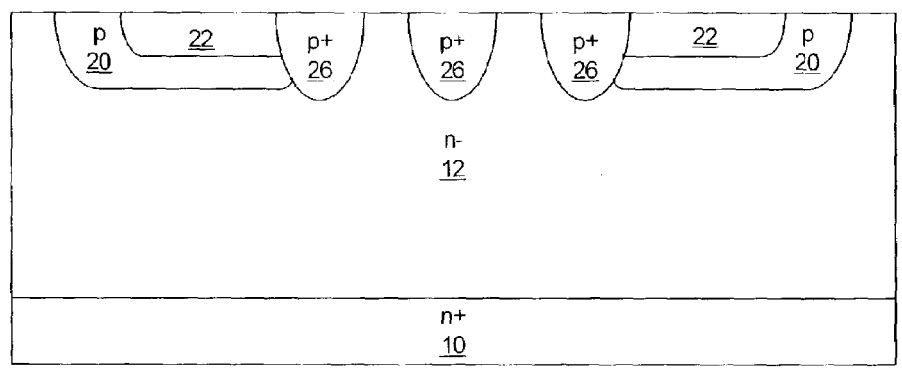

FIG. 3D illustrates the removal of the mask 120 as well as the creation of the n$^+$ layer 10, which may be formed by a backside implant of n-type impurities in a substrate or may be an epitaxial layer or the substrate itself and may be formed prior to FIG. 3A. The structure is also annealed at a temperature of from about 1400° C. to about 1850° C. for durations from about 1 second to about 2 hours to activate the implanted p-type and n-type impurities. Optionally, the structure may be capped with a dielectric layer, such as SiO$_2$ or Si$_3$N$_4$, to protection the structure during annealing. Alternatively, in embodiments where the gate oxide is annealed after formation to improve the SiC/SiO$_2$ interface, the activation of such impurities may be provided by such anneal.

Figure 3E:
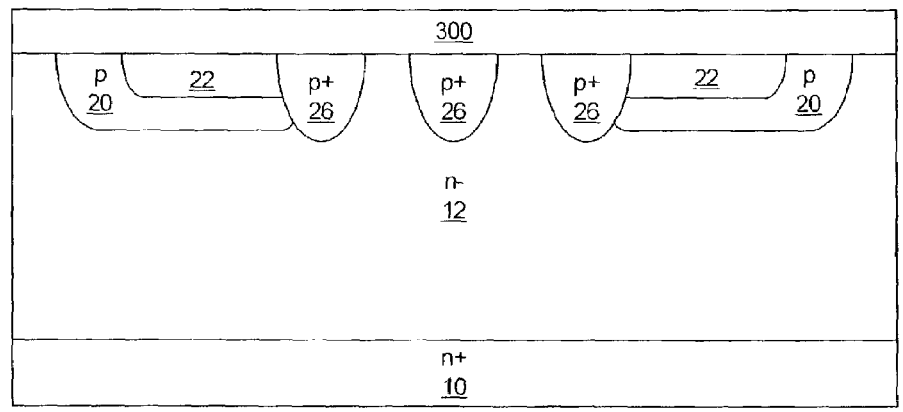

FIG. 3E illustrates the formation of the gate oxide layer 300. The gate oxide layer 300 may be thermally grown and may be a nitrided oxide and/or may be other oxides. The nitrided oxide may be any suitable gate oxide, however, in certain embodiments, SiO$_2$, oxynitride or ONO are utilized. Formation of the gate oxide or the initial oxide of an ONO gate dielectric may be followed by an anneal in N$_2$O or NO so as to reduce defect density at the SiC/oxide interface. In particular embodiments, the gate oxide layer 300 is formed either by thermal growth or deposition and then annealed in an N$_2$O environment at a temperature of greater than about 1100° C. and flow rates of from about 2 to about 8 SLM which may provide initial residence times of the N$_2$O of from about 11 to about 45 seconds. Such formation and annealing of an oxide layer on silicon carbide are described in commonly assigned U.S. patent application Ser. No. 09/834,283, entitled "METHOD OF N$_2$O ANNEALING AN OXIDE LAYER ON A SILICON CARBIDE LAYER" now U.S. Pat. No. 6,610,366, U.S. Provisional Application Ser. No. 60/237,822 entitled "Method of N$_2$O Growth of an oxide layer on a Silicon Carbide Layer" filed May 30, 2001, U.S. patent application Ser. No. 09/968,391 entitled "METHOD OF N$_2$O GROWTH OF AN OXIDE ON A SILICON CARBIDE LAYER" filed Oct. 1, 2001 and published as United States Patent Application Publication No. US 2002/0072247A1, and/or U.S. patent application Ser. No. 10/045,542 entitled "METHOD OF FABRICATING AN OXIDE LAYER ON A SILICON CARBIDE LAYER UTILIZING AN ANNEAL IN A HYDROGEN ENVIRONMENT" filed Oct. 26, 2001 and published as United States Patent Application Publication No. US 2002/0102358A1, the disclosures of which are incorporated herein by reference as if set forth frilly herein.

Additionally, an N$_2$O grown oxide may also be utilized as described in J. P. Xu, P. T. Lai, C. L. Chan, B. Li, and Y. C. Cheng, "Improved Performance and Reliability of N$_2$O-Grown Oxynitride on 6H—SiC," IEEE Electron Device Letters, Vol. 21, No. 6, pp. 298–300, June 2000. Techniques as described in L. A. Lipkin and J. W. Palmour, "Low interface state density oxides on p-type SiC," Materials Science Forum Vols. 264–268, pp. 853–856, 1998 may also be utilized. Alternatively, for thermally grown oxides, a subsequent NO anneal of the thermally grown SiO$_2$ layer may be provided to reduce the interface trap density as is described in M. K. Das, L. A. Lipkin, J. W. Palmour, G. Y. Chung, J. R. Williams, K. McDonald, and L. C. Feldman, "High Mobility 4H—SiC Inversion Mode MOSFETs Using Thermally Grown, NO Annealed SiO$_2$," IEEE Device Research Conference, Denver, Colo., Jun. 19–21, 2000; G.

Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H—SiC MOSFETs Following High Temperature Anneals in Nitric Oxide," IEEE Electron Device Letters accepted for publication; and G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, March 2000. Oxynitrides may be provided as described in U.S. patent application Ser. No. 09/878,442, entitled "HIGH VOLTAGE, HIGH TEMPERATURE CAPACITOR STRUCTURES AND METHODS OF FABRICATION" filed Jun. 11, 2001 and published as United States Patent Application Publication No. US 2002/003019A1, the disclosure of which is incorporated herein by reference as if set forth fully herein.

Figure 3F:
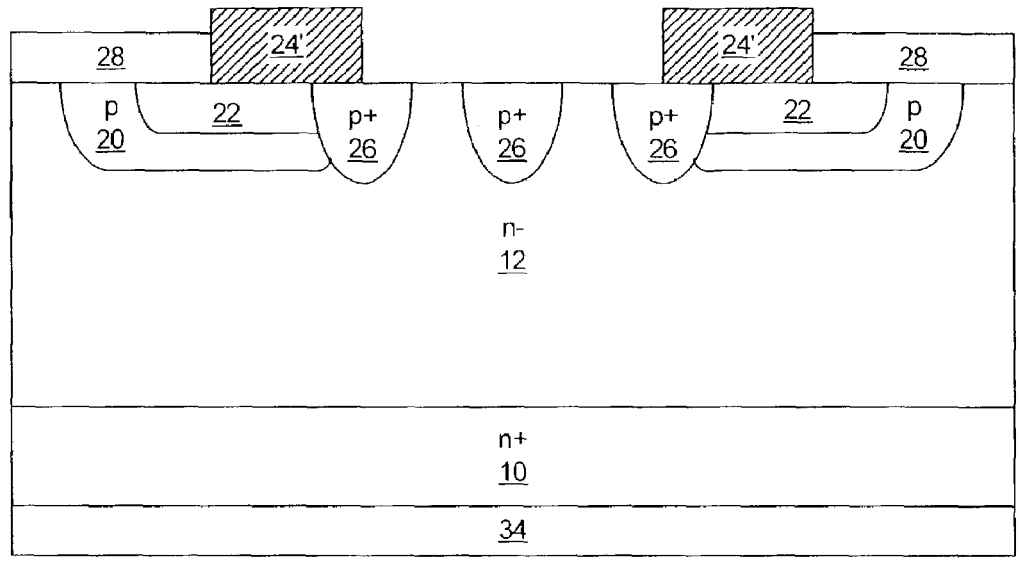

FIG. 3F illustrates the patterning of the gate oxide layer 300 to open contact windows for the source contact 24 and Schottky contact 30 and provide the patterned gate oxide 28. As seen in FIG. 3F, a window is opened in the gate oxide layer 300 to expose the n$^+$ regions 22, the p$^+$ regions 26. An ohmic contact material 24' is formed in the window on the exposed n$^+$ regions 22, the p$^+$ regions 26 and surface of the n$^-$ drift layer 12. Alternatively, the drain contact 34 may also be formed at this time. The ohmic contact material 24' and the drain contact 34 may be formed by evaporative deposition, sputtering or other such techniques known to those of skill in the art, then patterned by wet/dry etching or liftoff or other such techniques known to those of skill in the art. In certain embodiments, the ohmic contact material 24' and drain contact 34 are nickel that is annealed at about 825° C. after formation so as to improve the quality of the ohmic contact.

Figure 3G:
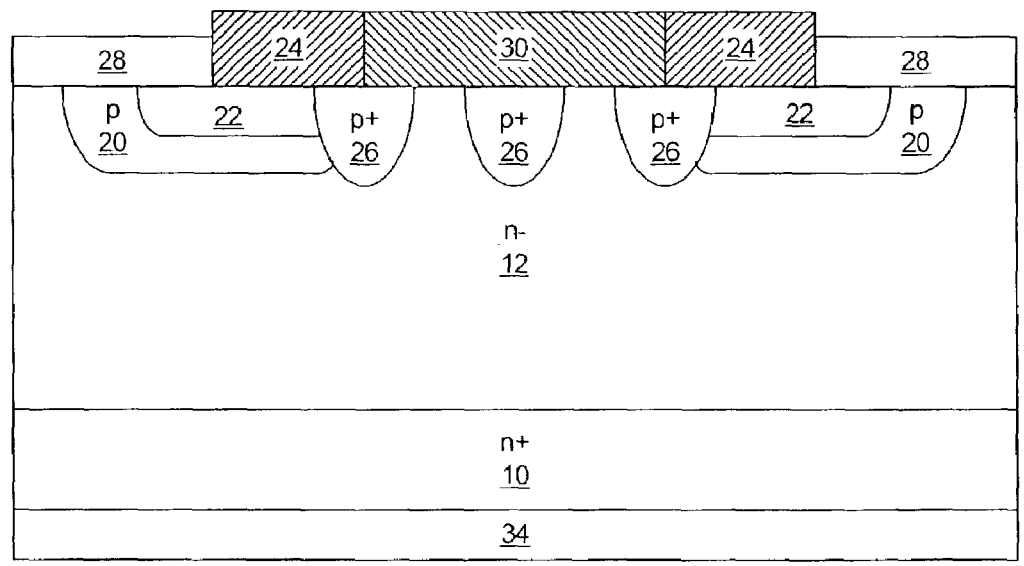

As seen in FIG. 3G, a Schottky material is formed in the open window on the p$^+$ regions 26 and a surface of the n$^-$ drift layer 12 to provide the Schottky contact 30. Alternatively, the Schottky contact material and the ohmic contact material may be same material, thus avoiding the need to open a Schottky contact window and deposit a Schottky contact material.

Figure 3H:
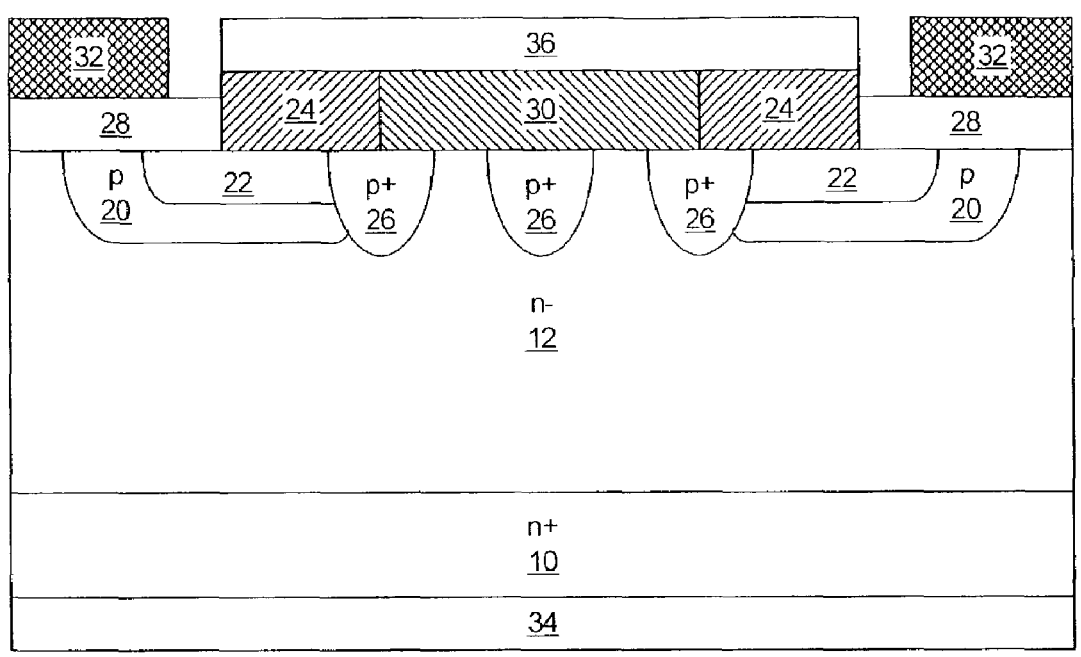

FIG. 3H illustrates formation of the gate contact 32. As described above, the gate contact 32 may be p-type polysilicon and/or may be other suitable contact material and may be formed and patterned utilizing techniques known to those of skill in the art. Finally, FIG. 3H illustrates formation of a metal overlayer 36 and drain contact 34 respectively, that may be formed by evaporative deposition, sputtering or other such techniques known to those of skill in the art. In certain embodiments, the drain contact 34 is nickel that is annealed at about 825° C. after formation so as to improve the quality of the ohmic contact.

In addition to the embodiments described herein, embodiments of the integral anti-parallel JBS diode may also be provided in DMOSFETs as described in U.S. patent application Ser. No. 09/911,995 filed Jul. 24, 2001 and entitled "SILICON CARBIDE POWER METAL-OXIDE SEMICONDUCTOR FIELD EFFECT TRANSISTORS HAVING A SHORTING CHANNEL AND METHODS OF FABRICATING SILICON CARBIDE METAL-OXIDE SEMICONDUCTOR FIELD EFFECT TRANSISTORS HAVING A SHORTING CHANNEL," and published as United States Patent Application Publication No. US 2002/0038891A1 the disclosure of which is incorporated herein as if set forth fully. Furthermore, embodiments of the present invention may also be provided with the DMOSFET described in U.S. Provisional Patent Application Ser. No. 60/435,212, entitled "VERTICAL JFET LIMITED SILICON CARBIDE POWER METAL-OXIDE SEMICONDUCTOR FIELD EFFECT TRANSISTORS AND METHODS OF FABRICATING VERTICAL JFET LIMITED SILICON CARBIDE METAL-OXIDE SEMICONDUCTOR FIELD EFFECT TRANSISTORS," filed Dec. 20, 2002, the disclosure of which is incorporated herein as if set forth fully. Additionally, the DMOSFET according to embodiments of the present invention may also be provided as described in commonly assigned and concurrently filed U.S. patent application Ser. No. 10/422,130, entitled "SILICON CARBIDE MOSFETS WITH SELF-ALIGNED SOURCE AND P-WELL REGIONS," the disclosure of which is incorporated herein by reference as if set forth fully herein.

While embodiments of the present invention have been described with reference to particular sequences of operations, as will be appreciated by those of skill in the art, certain operations within the sequence may be reordered while still benefiting from the teachings of the present invention. For example, in particular embodiments of the present invention, the formation of the n$^+$ region is 22 and the p$^+$ regions 26 may be reversed. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A silicon carbide semiconductor device, comprising:
   a silicon carbide DMOSFET; and
   an integral silicon carbide Schottky diode configured to have a turn-on voltage lower than a turn-on voltage of a built-in body diode of the DMOSFET, wherein the integral silicon carbide Schottky diode comprises an integral silicon carbide junction barrier Schottky (JBS) diode.

2. The silicon carbide semiconductor device of claim 1, wherein the integral JBS diode has a turn-on voltage of about 1 volt.

3. The silicon carbide semiconductor device of claim 1, wherein the silicon carbide Schottky diode comprises:
   a Schottky contact adjacent and coupled to the source region;
   a drift region common with a drift region of the DMOSFET; and
   a second contact common with a drain contact of the DMOSFET.

4. The silicon carbide semiconductor device of claim 3, wherein the silicon carbide Schottky diode further comprises a p-type junction barrier Schottky (JBS) grid adjacent a source region of the DMOSFET.

5. The silicon carbide semiconductor device of claim 4, wherein a p-type region of the JBS grid has an ohmic contact to a source electrode of the DMOSFET and contacts a p-type well region of the DMOSFET.

6. The silicon carbide semiconductor device of claim 3, wherein the Schottky contact is in direct contact with the source region.

7. The silicon carbide semiconductor device of claim 3, wherein the Schottky contact is coupled to the source region through a source contact of the DMOSFET.

8. The silicon carbide semiconductor device of claim 1, wherein an active area of the integral silicon carbide JBS diode is less than the active area of the silicon carbide DMOSFET.

9. The silicon carbide semiconductor device of claim 1, wherein the active area of the integral silicon carbide JBS diode is less than about 50% the active area of the silicon carbide DMOSFET.

10. The silicon carbide semiconductor device of claim 1, wherein the active area of the integral silicon carbide JBS diode is less than about 25% the active area of the silicon carbide DMOSFET.

11. The silicon carbide semiconductor device of claim 1, wherein the active area of the integral silicon carbide JBS diode is less than about 20% the active area of the silicon carbide DMOSFET.

12. The silicon carbide semiconductor device of claim 1, wherein the active area of the integral silicon carbide JBS diode is selected to flow a full switch current of the DMOSFET at a bias voltage of less than or equal to 2.6 V.

13. A silicon carbide semiconductor device, comprising:
a first n-type silicon carbide layer;
a p-type silicon carbide well region in the first n-type silicon carbide layer and extending to a first surface of the first n-type silicon carbide layer;
a second n-type silicon carbide layer in the first n-type silicon carbide layer adjacent a portion of p-type silicon carbide well region, the second n-type silicon carbide layer extending to the first surface of the first n-type silicon carbide layer and having a carrier concentration that is higher than a carrier concentration of the first n-type silicon carbide layer;
a gate insulator layer on the first n-type silicon carbide layer, the second n-type silicon carbide layer and the p-type silicon carbide well region;
a plurality of spaced apart p-type silicon carbide regions in the first n-type silicon carbide to provide a junction barrier grid, a peripheral one of the plurality of spaced apart p-type silicon carbide regions is adjacent the second n-type silicon carbide region and the p-type silicon carbide well region;
a Schottky contact on the first n-type silicon carbide layer and the plurality of p-type silicon carbide regions;
a source contact adjacent the Schottky contact and on the second n-type silicon carbide layer;
a gate contact on the gate insulator layer; and
a drain contact on the first n-type silicon carbide layer opposite the first surface of the first n-type silicon carbide layer.

14. The silicon carbide semiconductor device of claim 13, further comprising a third n-type silicon carbide layer disposed between the drain contact and the first n-type silicon carbide layer, the third n-type silicon carbide layer having a carrier concentration higher than a carrier concentration of the first n-type silicon carbide layer.

15. The silicon carbide semiconductor device of claim 13, further comprising a metal overlay on the source contact and the Schottky contact so as to connect the source contact to the Schottky contact.

16. The silicon carbide semiconductor device of claim 13, wherein the peripheral one of the plurality of p-type silicon carbide regions contacts the p-type silicon carbide well region and wherein the source contact is also on a portion of the peripheral one of the plurality of p-type silicon carbide regions.

17. The silicon carbide semiconductor device of claim 16, wherein the plurality of spaced apart p-type silicon carbide regions have a higher doping concentration than a doping concentration of the p-type silicon carbide well region.

18. The silicon carbide semiconductor device of claim 13, wherein the Schottky contact, the plurality of spaced apart p-type silicon carbide regions, the first n-type silicon carbide layer and the drain contact provide a Schottky diode having a turn-on voltage less than a turn-on voltage of a built-in pn junction of the first n-type layer of silicon carbide and the p-type well region.

19. The silicon carbide semiconductor device of claim 13, wherein the first n-type silicon carbide layer has a doping concentration of from about $5 \times 10^{14}$ to about $2 \times 10^{16}$ cm$^{-3}$.

20. The silicon carbide semiconductor device of claim 13, wherein the first n-type silicon carbide layer has a thickness of from about 5 to about 30 µm.

21. The silicon carbide semiconductor device of claim 13, wherein the p-type silicon carbide well region has a doping concentration of from about $10^{16}$ to about $10^{20}$ cm$^{-3}$.

22. The silicon carbide semiconductor device of claim 13, wherein the p-type silicon carbide well region extends to a depth of from about 0.5 to about 1.5 µm into the first n-type silicon carbide layer.

23. The silicon carbide semiconductor device of claim 13, wherein the plurality of spaced apart p-type silicon carbide regions have a doping concentration of from about $10^{18}$ to about $10^{20}$ cm$^{-3}$.

24. The silicon carbide semiconductor device of claim 13, wherein the plurality of spaced apart p-type silicon carbide regions are spaced apart a distance of from about 0.5 to about 10 µm.

25. The silicon carbide semiconductor device of claim 13, wherein the plurality of spaced apart p-type silicon carbide regions are uniformly spaced apart.

26. The silicon carbide semiconductor device of claim 13, wherein the plurality of spaced apart p-type silicon carbide regions are non-uniformly spaced apart.

27. The silicon carbide semiconductor device of claim 13, wherein the plurality of spaced apart p-type silicon carbide regions have respective widths of from about 0.5 to about 10 µm.

28. The silicon carbide semiconductor device of claim 13, wherein the second n-type silicon carbide layer has a doping concentration of from about $10^{19}$ to about $10^{21}$ cm$^{-3}$.

29. The silicon carbide semiconductor device of claim 13, wherein the second n-type silicon carbide layer extends to a depth of from about 0.1 to about 0.7 µm into the first n-type silicon carbide layer.

30. A silicon carbide semiconductor device, comprising:
a silicon carbide DMOSFET; and
junction barrier Schottky (JBS) diode means for at least partially bypassing a built-in pn junction diode between a well region and a drift region of the DMOSFET when a negative voltage is applied to a drain of the DMOSFET, the JBS diode means for at least partially bypassing being integral to the silicon carbide DMOSFET.

31. The silicon carbide semiconductor device according to claim 30, wherein the means for at least partially bypassing comprises an integral silicon carbide diode between a source contact and a drain contact of the DMOSFET, the integral silicon carbide diode having a lower turn-on voltage than the built-in pn junction diode.

32. The silicon carbide semiconductor device according to claim 30, wherein the means for at least partially bypassing comprises means for completely bypassing a built-in pn junction diode between a well region and a drift region of the DMOSFET when a negative voltage is applied to a drain of the DMOSFET, the means for completely bypassing being integral to the silicon carbide DMOSFET.

33. A method of fabricating a silicon carbide semiconductor device, comprising:
forming a silicon carbide DMOSFET; and
forming an integral silicon carbide junction barrier Schottky (JBS) diode configured to have a turn-on voltage lower than a turn-on voltage of a built-in body diode of the DMOSFET.

34. The method of claim 33, wherein forming an integral JBS diode comprises forming an integral JBS diode having a turn-on voltage of about 1 volt.

35. The method of claim 33, wherein forming a silicon carbide Schottky diode comprises:
forming a Schottky contact adjacent and coupled to the source region;
forming a drift region common with a drift region of the DMOSFET; and
forming a second contact common with a drain contact of the DMOSFET.

36. The method of claim 35, wherein forming a silicon carbide Schottky diode further comprises forming a p-type junction barrier Schottky (JBS) grid adjacent a source region of the DMOSFET.

37. The method of claim 36, wherein forming a p-type JBS grid a p-type region of the JBS grid has an ohmic contact to a source electrode of the DMOSFET and contacts a p-type well region of the DMOSFET.

38. The method of claim 35, wherein forming a Schottky contact comprises forming a Schottky contact in direct contact with the source region.

39. The method of claim 35, wherein forming a Schottky contact comprises forming a Schottky contact that is coupled to the source region through a source contact of the DMOSFET.

40. The method of claim 33, wherein forming a silicon carbide JBS diode comprises forming an integral silicon carbide JBS diode having an active area that is less than the active area of the silicon carbide DMOSFET.

41. The method of claim 33, wherein forming a silicon carbide JBS diode comprises forming an integral silicon carbide JBS diode having an active area that is less than about 50% the active area of the silicon carbide DMOSFET.

42. The method of claim 33, wherein forming a silicon carbide JBS diode comprises forming an integral silicon carbide JBS diode having an active area that is less than about 25% the active area of the silicon carbide DMOSFET.

43. The method of claim 33, wherein forming a silicon carbide JBS diode comprises forming an integral silicon carbide JBS diode having an active area that is less than about 20% the active area of the silicon carbide DMOSFET.

44. A method of fabricating a silicon carbide semiconductor device, comprising:
forming a first n-type silicon carbide layer;
forming a p-type silicon carbide well region in the first n-type silicon carbide layer and extending to a first surface of the first n-type silicon carbide layer;
forming a second n-type silicon carbide layer in the first n-type silicon carbide layer adjacent a portion of p-type silicon carbide well region, the second n-type silicon carbide layer extending to the first surface of the first n-type silicon carbide layer and having a carrier concentration that is higher than a carrier concentration of the first n-type silicon carbide layer;
forming a gate insulator layer on the first n-type silicon carbide layer, the second n-type silicon carbide layer and the p-type silicon carbide well region;
forming a plurality of spaced apart p-type silicon carbide regions in the first n-type silicon carbide to provide a junction barrier grid, a peripheral one of the plurality of spaced apart p-type silicon carbide regions is adjacent the second n-type silicon carbide region and the p-type silicon carbide well region;
forming a Schottky contact on the first n-type silicon carbide layer and the plurality of p-type silicon carbide regions;
forming a source contact adjacent the Schottky contact and on the second n-type silicon carbide layer;
forming a gate contact on the gate insulator layer; and
forming a drain contact on the first n-type silicon carbide layer opposite the first surface of the first n-type silicon carbide layer.

45. The method of claim 44, further comprising forming a third n-type silicon carbide layer disposed between the drain contact and the first n-type silicon carbide layer, the third n-type silicon carbide layer having a carrier concentration higher than a carrier concentration of the first n-type silicon carbide layer.

46. The method of claim 44, further comprising forming a metal overlay on the source contact and the Schottky contact so as to connect the source contact to the Schottky contact.

47. The method of claim 44, wherein forming a plurality of spaced apart p-type silicon carbide regions comprises forming a plurality of spaced apart p-type silicon carbide regions such that the peripheral one of the plurality of p-type silicon carbide regions contacts the p-type silicon carbide well region and wherein forming a source contact further comprises forming a source on a portion of the peripheral one of the plurality of p-type silicon carbide regions.

48. The method of claim 47, wherein the plurality of spaced apart p-type silicon carbide regions have a higher doping concentration than a doping concentration of the p-type silicon carbide well region.

49. The method of claim 44, wherein the Schottky contact, the plurality of spaced apart p-type silicon carbide regions, the first n-type silicon carbide layer and the drain contact are formed to provide a Schottky diode having a turn-on voltage less than a turn-on voltage of a built-in pn junction of the first n-type layer of silicon carbide and the p-type well region.

* * * * *